United States Patent
Woo et al.

(10) Patent No.: US 12,153,300 B2
(45) Date of Patent: Nov. 26, 2024

(54) DISPLAY DEVICE AND MANUFACTURING METHOD THEREOF

(71) Applicant: LG Display Co., Ltd., Seoul (KR)

(72) Inventors: Sangyong Woo, Paju-si (KR); Hyunji Son, Paju-si (KR); Sooyoung Choi, Paju-si (KR); Hyejung Jin, Paju-si (KR); Dahee Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/980,697

(22) Filed: Nov. 4, 2022

(65) Prior Publication Data

US 2023/0213806 A1 Jul. 6, 2023

(30) Foreign Application Priority Data

Dec. 31, 2021 (KR) .......................... 10-2021-0193659

(51) Int. Cl.
*G02F 1/1333* (2006.01)
*G02F 1/1343* (2006.01)
(Continued)

(52) U.S. Cl.
CPC ...... *G02F 1/13338* (2013.01); *G02F 1/13439* (2013.01); *G02F 1/136209* (2013.01);
(Continued)

(58) Field of Classification Search
CPC ............. H01L 29/78633; H01L 27/124; H01L 27/1288; G02F 2201/121; G02F 2203/04103; G02F 1/13338; G02F 1/13439; G02F 1/136209; G02F 1/136295; G02F 1/133345; G02F 1/1368; G02F 1/134372;
(Continued)

(56) References Cited

U.S. PATENT DOCUMENTS 11,036,107 B2 * 6/2021 Kajita ................... G02F 1/1362
11,099,674 B2 * 8/2021 Chiu .................... G06F 3/0412
(Continued)

FOREIGN PATENT DOCUMENTS

CN 103399665 A * 11/2013 ....... G02F 1/136286
CN 111367431 A * 7/2020 ........... G06F 3/0412
(Continued)

OTHER PUBLICATIONS

Intellectual Property Office of the United Kingdom, Combined Search and Examination Report, United Kingdom Patent Application No. GB2216512.0, May 15, 2023, eight pages.

*Primary Examiner* — Ricardo Osorio

(74) *Attorney, Agent, or Firm* — Fenwick & West LLP

(57) ABSTRACT

Disclosed is a display device and a method of manufacturing the display device. The display device includes a pixel electrode disposed in an opening area; a common electrode having at least one region that overlaps the pixel electrode in the opening area; a gate line extending along a row direction in a non-opening area that surrounds the opening area; a data line extending along the non-opening area in a column direction that is perpendicular to the row direction; and a touch sensing line extending in the column direction across the opening area, wherein the opening area may have a shape in which a length of the opening area in the row direction is longer than a length of the opening area in the column direction.

11 Claims, 19 Drawing Sheets

(51) Int. Cl.
*G02F 1/1362* (2006.01)
*G06F 3/041* (2006.01)
*G06F 3/044* (2006.01)
*H01L 27/12* (2006.01)
*H01L 29/786* (2006.01)
*G02F 1/1368* (2006.01)

(52) U.S. Cl.
CPC ...... *G02F 1/136295* (2021.01); *G06F 3/0412* (2013.01); *G06F 3/0445* (2019.05); *H01L 27/124* (2013.01); *H01L 27/1288* (2013.01); *H01L 29/78633* (2013.01); *G02F 1/133345* (2013.01); *G02F 1/1368* (2013.01); *G02F 2201/121* (2013.01); *G06F 2203/04103* (2013.01)

(58) Field of Classification Search
CPC ......... G02F 1/136286; G02F 1/133514; G02F 1/1343; G06F 3/0412; G06F 3/0445; G06F 2203/04103; G06F 3/04164; G06F 3/0443; G06F 3/0446; G06F 3/0448; G06F 2203/04111; G06F 2203/04112; G06F 2201/121; G09G 3/2003; G09G 2310/0202
See application file for complete search history.

(56) References Cited

U.S. PATENT DOCUMENTS

| | | | | |
|---|---|---|---|---|
| 11,307,701 | B2* | 4/2022 | Morinaga | G06F 3/0443 |
| 11,402,936 | B2 | 8/2022 | Cha et al. | |
| 2010/0225609 | A1* | 9/2010 | Huang | G02F 1/13338 |
| | | | | 345/206 |
| 2014/0192302 | A1* | 7/2014 | Kim | G02F 1/133377 |
| | | | | 349/110 |
| 2019/0079620 | A1* | 3/2019 | Yoshida | G02F 1/1368 |
| 2019/0204972 | A1* | 7/2019 | Shin | G06F 3/0412 |
| 2020/0272011 | A1* | 8/2020 | Yoshida | G06F 3/0412 |
| 2020/0272012 | A1* | 8/2020 | Yoshida | G02F 1/136286 |
| 2021/0191208 | A1* | 6/2021 | Lee | G02F 1/134318 |
| 2021/0200362 | A1 | 7/2021 | Cha et al. | |
| 2022/0326798 | A1 | 10/2022 | Cha et al. | |
| 2022/0342499 | A1 | 10/2022 | Hu et al. | |

FOREIGN PATENT DOCUMENTS

| | | | | |
|---|---|---|---|---|
| EP | 3842903 A1 | 6/2021 | | |
| GB | 2570799 A | 8/2019 | | |
| KR | 20140094217 A | * 7/2014 | | |
| KR | 10-2021-0083876 A | 7/2021 | | |
| WO | WO-2015010376 A1 | * 1/2015 | ....... G02F 1/136286 |
| WO | WO 2021/169611 A1 | 9/2021 | | |

* cited by examiner

DISPLAY DEVICE AND MANUFACTURING METHOD THEREOF

CROSS-REFERENCE TO RELATED APPLICATION

The present application claims priority to Republic of Korea Patent Application No. 10-2021-0193659, filed Dec. 31, 2021, which is hereby incorporated by reference in its entirety.

BACKGROUND

Field

The present disclosure relates to a display device and a manufacturing method thereof.

Description of the Related Art

As information society develops, various types of display devices have been developed. Recently, various display devices, such as a liquid crystal display (LCD), a plasma display panel (PDP), and an organic light emitting display (OLED) have been used.

Recently, a touch screen capable of displaying an image and sensing a user's touch has been widely used. The touch screen may have a structure of an add-on type, an on-cell type, and an in-cell type. Among them, the touch screen having the in-cell type structure can reduce the thickness and improve durability of the display device.

SUMMARY

Technical Problem

The embodiments herein describe, with respect to the in-cell type structure, a display device including a common electrode extending in a horizontal direction and a manufacturing method of the same.

Also, the embodiments describe a display device in which a touch sensing line and a source-drain electrode are disposed on a same layer, and a manufacturing method of the same.

Technical Solution

A display device according to an embodiment of the present disclosure comprises a pixel electrode disposed in an opening area; a common electrode having at least one region that overlaps the pixel electrode in the opening area; a gate line extending along a row direction in a non-opening area, the non-opening area surrounding the opening area; a data line extending along the non-opening area in a column direction that is perpendicular to the row direction; and a touch sensing line extending in the column direction across the opening area. The opening area has a shape in which a length of the opening area in the row direction is longer than a length of the opening area in the column direction In one embodiment, a manufacturing method of a display device according to an embodiment of the present disclosure comprises: forming a light blocking layer on a substrate using a first mask, the substrate including an opening area and a non-opening area that surrounds the opening area; forming an active layer on the light blocking layer using a second mask; forming an active layer on the light blocking layer using a second mask; forming an interlayer-insulating layer that covers the gate line; forming a first contact hole that exposes one region of the active layer using a fourth mask; forming a data line that extends in a column direction that is perpendicular to the row direction in the non-opening area, and a touch sensing line that extends in the column direction across the opening area using a fifth mask; and forming a pixel electrode in the opening area using a sixth mask, wherein the opening area has a shape in which a length of the opening area in the row direction is longer than a length of the opening area in the column direction.

In one embodiment, a display device comprises: a plurality of pixels including a pixel having an opening area in which an image is displayed and a non-opening area where the image is not displayed, the opening area having a length in a first direction that is longer than a length of the opening area in a second direction that is different from the first direction; a plurality of gate lines connected to the plurality of pixels, the plurality of gate lines including a gate line that extends in the first direction in the non-opening area of the pixel; a plurality of data lines connected to the plurality of pixels, the plurality of data lines including a data line that extends in the second direction in the non-opening area of the pixel; a plurality of touch sensing lines including a touch sensing line that extends in the second direction across the opening area of the pixel; wherein the pixel includes a pixel electrode in the opening area of the pixel and a common electrode having a portion that overlaps the pixel electrode in the opening area, the portion of the common electrode having a length in the first direction that is longer than a length of the portion of the common electrode in the second direction.

DETAILED DESCRIPTION

Figure 1:
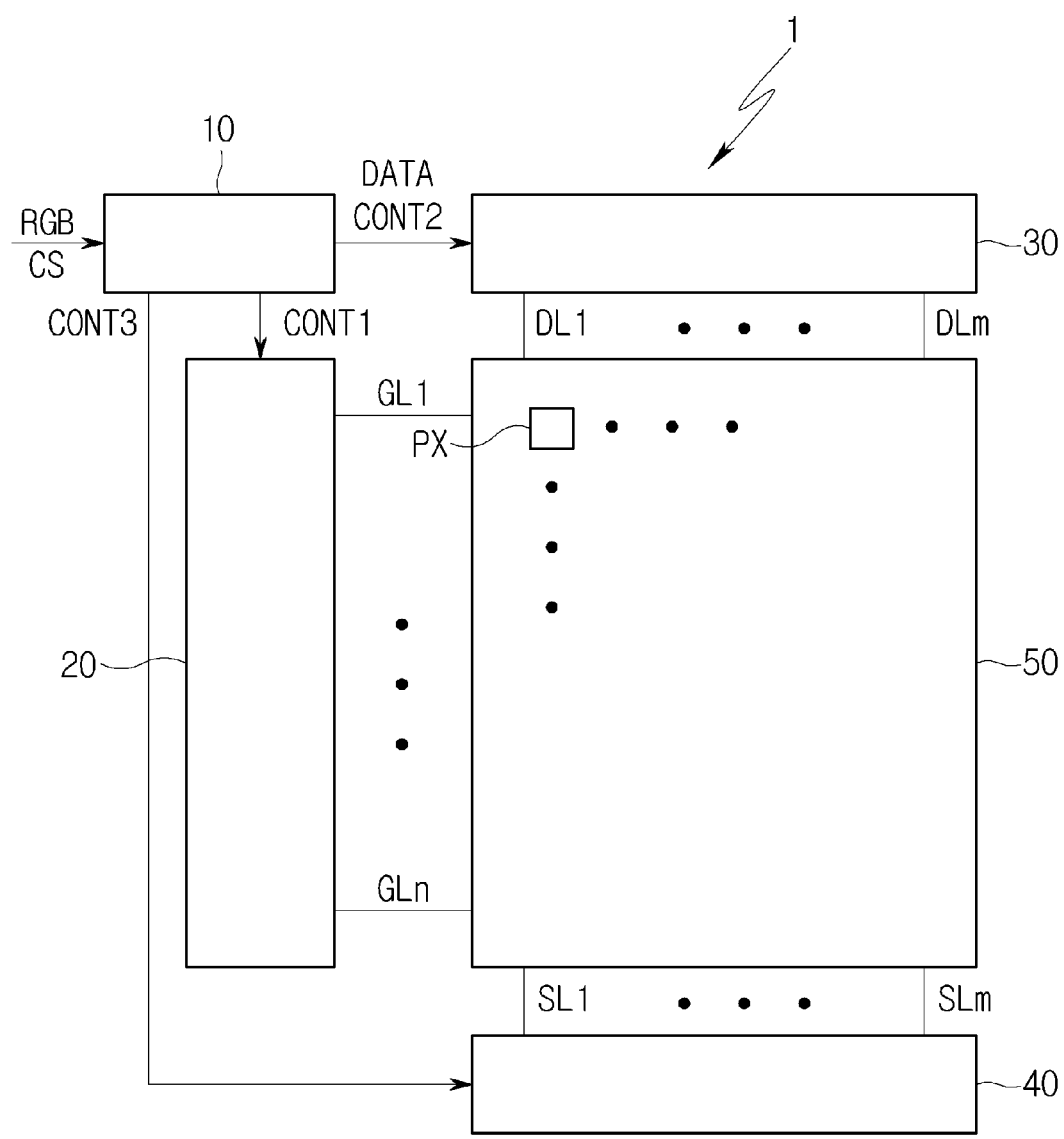
FIG. 1 is a block diagram illustrating a configuration of a display device according to an embodiment of the present disclosure.

Hereinafter, embodiments of the present disclosure will be described with reference to drawings. In this specification, when a component (or region, layer, part, etc.) is referred to as being "on", "connected" to, or "joined" to another component, it means that the component can be directly connected/coupled to the other component or a third component can be arranged between them.

The same reference numbers refer to the same components. In addition, in the drawings, the thickness, ratio, and dimension of the components are exaggerated for effective description of technical contents. An "and/or" includes one or more combinations capable of being defined by the associated configurations.

Terms such as "first" and "second" may be used to describe various components, but the components are not limited by the terms. The terms are used only for the purpose of distinguishing one component from other components. For example, the first component may be referred to as the second component without departing from a scope of right of the present embodiments, and similarly, the second component may also be referred to as the first component. Singular expressions include plural expressions unless the context clearly indicates otherwise.

Terms such as "below", "lower", "above", "upper", etc. are used to describe the association of components shown in the figures. The terms are relative concepts and are explained based on the directions indicated in the drawings.

It should be understood that terms such as "comprise" or "have", etc. are intended to indicate that a feature, number, step, operation, component, part, or combination thereof is described in the specification, and that the possibility of the presence or addition of one or more of other features or numbers, steps, operations, components, parts, or these combinations thereof is not excluded in advance.

FIG. 1 is a block diagram illustrating a configuration of a display device according to an embodiment of the present disclosure.

Referring to FIG. 1, a display device 1 includes a timing controller 10, a gate driver 20, a data driver 30, a touch driver 40, and a display panel 50.

The timing controller 10 may receive an image signal RGB and a control signal CS from the outside the display device (e.g., a host system). The image signal RGB may include a plurality of grayscale data. The control signal CS may include, for example, a horizontal synchronization signal, a vertical synchronization signal, and a main clock signal.

The timing controller 10 processes the image signal RGB and the control signal CS according to an operating condition of the display panel 50, and may generate and output an image data DATA, a gate driving control signal CONT1, a data driving control signal CONT2, and a touch driving control signal CONT3.

The gate driver 20 may be connected to pixels (or sub-pixels) PX of the display panel 50 through a plurality of gate lines GL1 to GLn. The gate driver 20 may generate gate signals on the basis of the gate driving control signal CONT1 output from the timing controller 10. The gate driver 20 may provide the generated gate signals to the pixels PX through the plurality of gate lines GL1 to GLn.

The data driver 30 may be connected to pixels PX of the display panel 50 through a plurality of data lines DLI to DLm. The data driver 30 may generate data signals on the basis of the data driving control signal CONT2 and the image data DATA output from the timing controller 10. The data driver 30 may provide the generated data signals to the pixels PX through the plurality of data lines DLI to DLm. The data signals may be applied to the pixels PX of the pixel column selected by the gate signal. To this end, the data driver 30 may supply data signals to the plurality of data lines DLI to DLm to be synchronized with the gate signal.

The touch driver 40 may be connected to pixels PX of the display panel 50 through a plurality of sensing lines SL1 to SLm. The touch driver 40 may generate a touch scan signal on the basis of the touch driving control signal CONT3 output from the timing controller 10 and provide the same to the pixels PX. The touch driver 40 may receive a touch sensing signal through a plurality of sensing lines SL1 to SLm and detect a touch input on the basis of the received touch sensing signal.

A plurality of pixels PX are disposed on the display panel 50. The pixels PX may be arranged in, for example, a matrix form on the display panel 50.

Each pixel PX may be electrically connected to corresponding gate line and data line. The pixels PX may emit light with luminance corresponding to the gate signals and the data signals supplied through the gate lines GL1 to GLn and the data lines DLI to DLm.

Each pixel PX may display any one of the first to third colors. According to an aspect, each pixel PX may display any one of red, green, and blue colors. According to another aspect, each pixel PX may display any one of cyan, magenta, and yellow colors. In various embodiments, the pixels PX may be configured to display any one of four or more colors. For example, each pixel PX may display any one of red, green, blue, and white colors.

The display panel 50 may be configured in an in-cell touch type panel capable of sensing a touch input. For example, the display panel 50 may be configured to include a pixel electrode that is driven by receiving a common voltage during a display period within one frame, and receiving a touch scan voltage during a touch detection period within one frame. The common voltage for displaying an image during the display period and the touch scan voltage for detecting a touch during the touch detection period may be applied to a pixel electrode of pixels PX. The pixel electrode may operate as a display driving electrode driving a liquid crystal together with the common electrode during the display period, and may operate as a touch sensing electrode TE detecting a touch position during the touch detection period. The touch sensing electrode may be sequentially driven for one frame, but are not limited thereto.

The timing controller 10, the gate driver 20, the data driver 30, and the touch driver 40 may be each configured as a separate integrated circuit IC or may be configured as an integrated circuit in which at least a portion thereof is integrated. For example, at least one of the data driver 30 and the touch driver 40 may be integrated with the timing controller 10 to be configured as an integrated circuit.

In addition, although the gate driver 20 and the data driver 30 are shown as components separate from the display panel 50 in FIG. 1, at least one of the gate driver 20 and the data driver 30 may be configured in an in-panel manner as to be formed integrally with the display panel 50. For example, the gate driver 20 may be integrally formed with the display panel 50 according to a gate in panel (GIP) manner.

Figure 2:
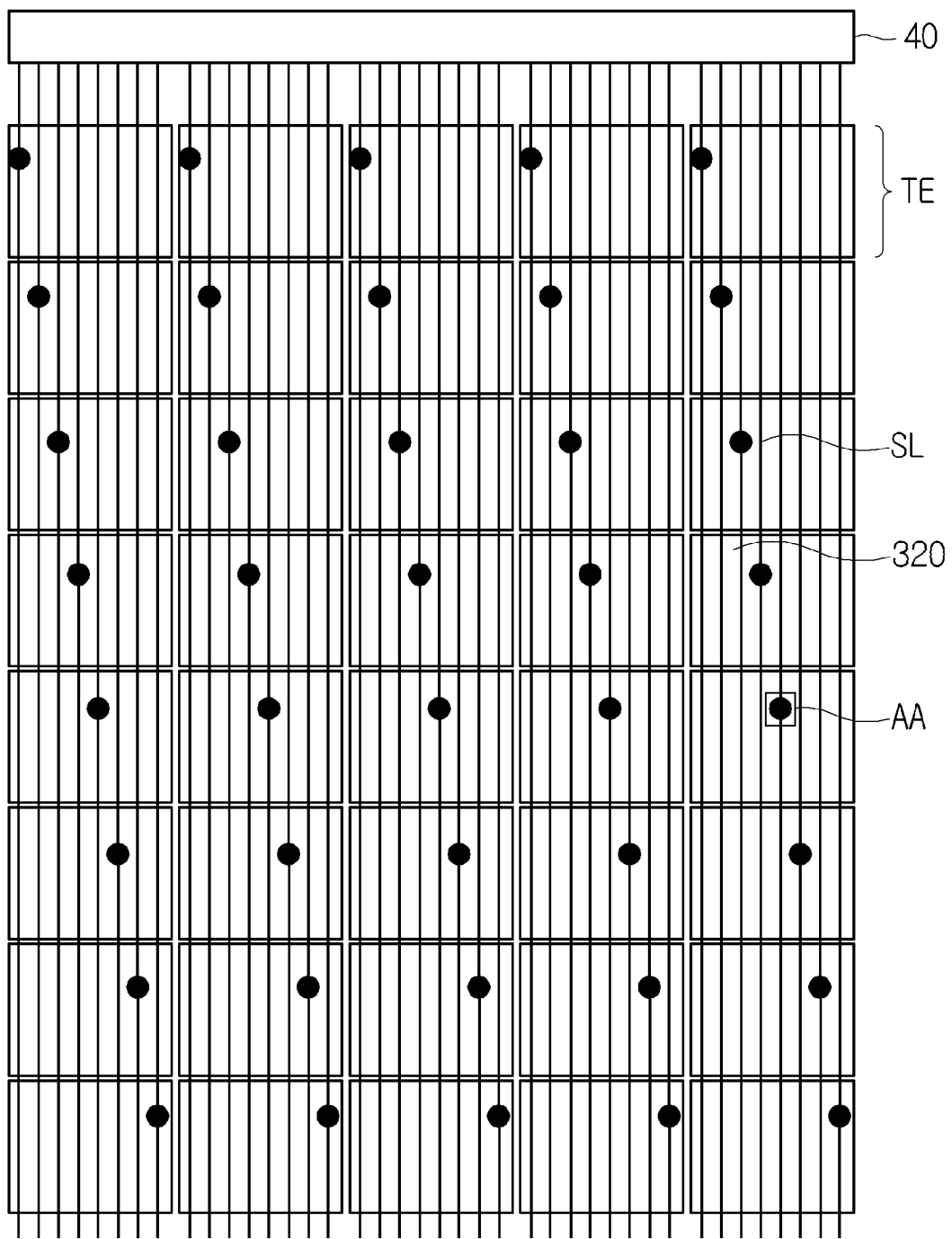
FIG. 2 is a plan view illustrating a structure of a touch sensing electrode and a touch sensing line shown in FIG. 1 according to an embodiment of the present disclosure.

FIG. 2 is a plan view illustrating a structure of a touch sensing electrode and a touch sensing line shown in FIG. 1 according to one embodiment.

Referring to FIG. 2, the display panel 50 may include a plurality of touch sensing electrodes TE. The touch sensing electrode TE may include one or more common electrodes 320.

Each touch sensing electrode TE is connected to a corresponding touch sensing line SL. The touch sensing electrode TE and the touch sensing line SL may be connected to each other in a one to one relationship. For example, each touch sensing line SL may be connected to one common electrode 320 disposed in one touch sensing electrode TE.

A touch sensing line SL may transmit the common voltage to the touch sensing electrode TE connected to the touch sensing line SL during the display period, and transmit the touch scan signal to the touch sensing electrode TE during the touch sensing period. Also, the touch sensing line SL may sense a change in an electrical characteristic of the touch sensing electrode TE (e.g., a change in capacitance load), and output as an electrical signal.

Figure 3:
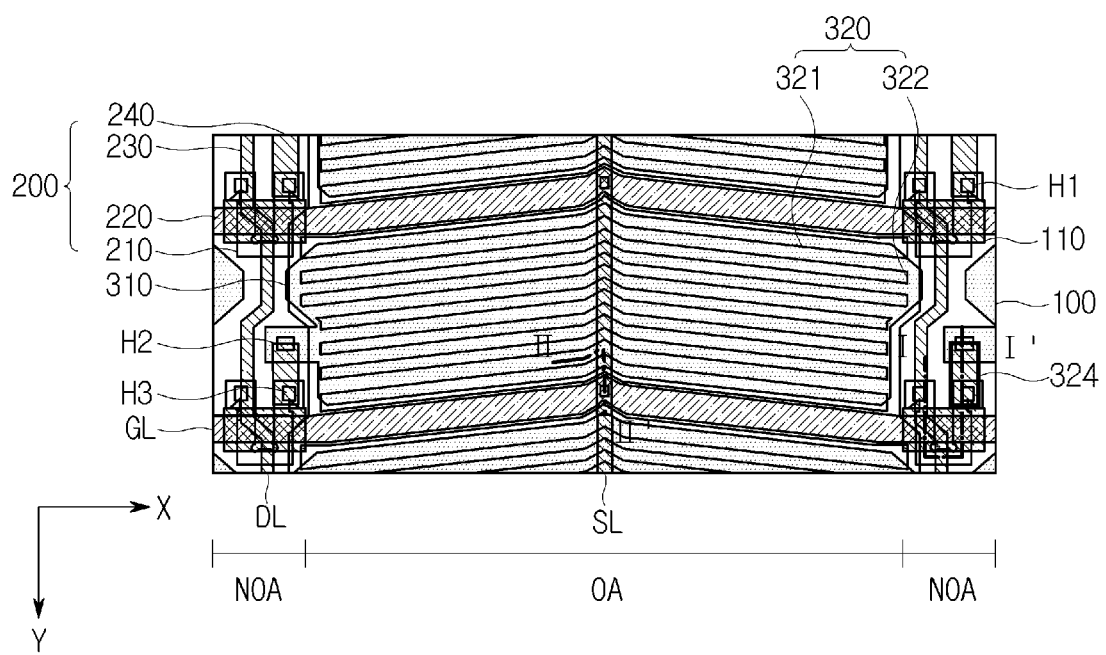
FIG. 3 is an enlarged plan view of area AA of FIG. 2 according to an embodiment of the present disclosure.

The touch scan signal supplied through the touch sensing line SL may be a plurality of clock signals. When a user touches the display panel 50 using a finger or an electronic pen, a capacitance is formed between the touch sensing electrodes TE. A touch input may be detected. When a user touches the display panel 50 using a finger or an electronic pen, a capacitance is formed between the touch sensing electrodes TE, and the touch input may be detected by comparing the formed capacitance with the reference capacitance. FIG. 3 is an enlarged plan view of area AA of FIG. 2 according to one embodiment.

Each of the pixels PX includes an opening area OA in which an image is displayed by an electric field between a pixel electrode 310 and the common electrode 320, and a non-opening area NOA that has a driving element, for example, a thin film transistor 200, disposed for driving the common electrode 320 and the pixel electrode 310 of the opening area OA and that surrounds the opening area. Here, the opening area OA may be a display area in which an image is displayed, and the non-opening area NOA may be a non-display area in which an image is not displayed. The opening area OA and the non-opening area NOA may be alternately disposed along a row direction X. In the present embodiment, the opening area OA may have a shape in which a length in the row direction X may be equal to or longer than a length in the column direction Y.

The common electrode 320 receives a common voltage during a display period in one frame, and forms an electric field with the pixel electrode 310. The common electrode 320 includes branch portions 321 (e.g., protrusions) arranged side by side at equal intervals in the column direction Y and a stem portion 322 (e.g., a connecting part) connecting the branch portions 321 to each other. By disposing the branch portions 321 at equal intervals in the column direction Y, a distance between each pair of adjacent branch portions 321 is the same. The branch portions 321 may extend substantially in the row direction X within the opening area OA, and the stem portions 322 may extend in the column direction Y while connecting the branch portions 321 to each other at both ends of the branch portions 321. Here, a length of the branch portions 321 may be formed to be longer than a length of the stem portions 322. The common electrode 320 is generally formed in the opening area OA, and may be arranged in such a manner as to expand from the opening area OA to the non-opening area NOA.

The pixel electrode 310 may be widely formed in the opening area OA. When the opening area OA is formed in such a manner that a length in the row direction X that is longer than a length of the column direction Y, the pixel electrode 310 may have a generally rectangular shape in which a length in the row direction X is longer than a length in the column direction Y along the shape of the opening area OA.

The data line DL, the gate line GL, and the driving element such as the thin film transistor 200 may be disposed in the non-opening area NOA.

The data line DL extends along the column direction Y in the non-opening area NOA disposed between the opening areas OA of adjacent pixel columns. The data line DL is connected to the pixel electrode 310, and may transmit the data signal to the pixel electrode 310.

The gate line GL extends along the row direction X in the non-opening area NOA disposed between the opening areas OA of adjacent pixel rows.

The touch sensing line SL crosses the opening area OA and extends along the column direction Y. The touch sensing line SL is disposed on the same layer as the data lines DL disposed in the non-opening area NOA. The touch sensing line SL is formed in the column direction Y crossing the opening area OA, and thus does not overlap the data lines DL. Here, the data lines DL and the touch sensing lines SL may be alternately disposed along the row direction X on the display panel 50.

The thin film transistor 200 includes a gate electrode 220 connected to the gate line GL, a source electrode 230 connected to the data line DL, and a drain electrode 240 spaced apart from the source electrode 230. The drain electrode 240 of the thin film transistor 200 may be connected to the pixel electrode 310 through a contact hole.

As illustrated, the pixel PX according to the present embodiment has a horizontal electrode structure in that the opening area OA of the pixel PX extends substantially in the row direction X, and the branch portion 321 of the common electrode 320 extends substantially in the row direction X.

Hereinafter, a detailed stack structure of the pixel structure above will be described in detail.

Figure 4:
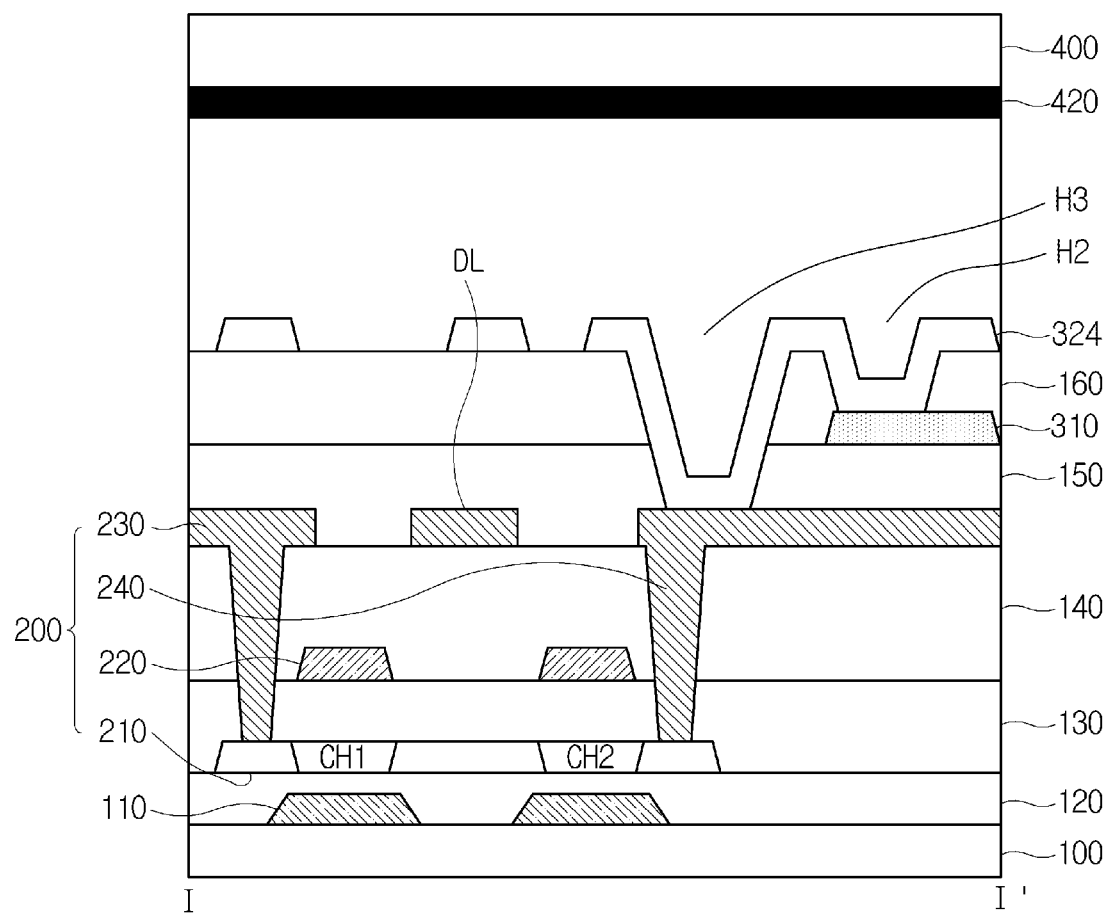
FIG. 4 is a cross-sectional view taken along line I-I' of FIG. 3 according to an embodiment of the present disclosure.
Figure 5:
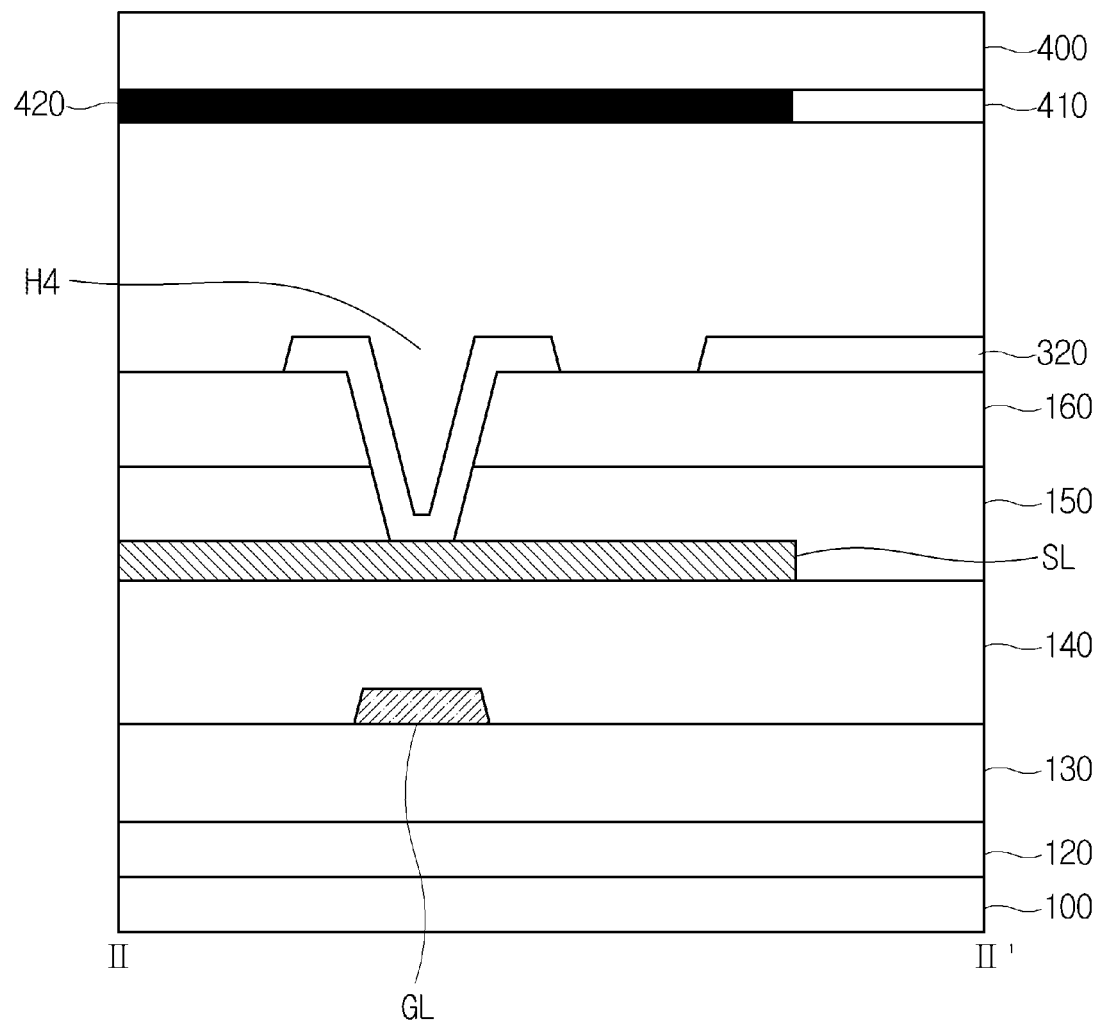
FIG. 5 is a cross-sectional view taken along line II-II' of FIG. 3 according to an embodiment of the present disclosure.

FIG. 4 is a cross-sectional view taken along line I-I' of FIG. 3 according to one embodiment, and FIG. 5 is a cross-sectional view taken along line II-II' of FIG. 3 according to one embodiment.

Referring to FIG. 3 together with FIGS. 4 and 5, the display device 1 according to an embodiment includes a substrate 100, circuit elements disposed on the substrate, and the common electrode 320 and the pixel electrode 310 for displaying an image.

The substrate 100 may be a light transmitting substrate, as a base substrate of the display panel 50. The substrate 100 may be a rigid substrate including glass or tempered glass, or a flexible substrate made of plastic material. For example, the substrate 100 may be formed of a plastic material, such as polyimide, polyethylene terephthalate (PET), polyethylene naphthalate (PEN), polycarbonate (PC), and the like. However, the material of the substrate 100 is not limited thereto.

The opening area OA and the non-opening area NOA are formed on the substrate 100. The opening area OA may be defined as an area where an image is displayed according to an electric field between the pixel electrode 310 and the common electrode 320. The non-opening area NOA may be defined as an area in which a driving element for driving the pixel electrode 310 of the opening area OA, for example, the thin film transistor 200 and wirings are disposed.

A light blocking layer 110 may be formed on the substrate 100. The light blocking layer 110 is disposed to be overlapped with a semiconductor pattern of the thin film transistor 200 (e.g., channel regions (CH1, CH2) of an active layer 210 on a plane view), thereby protecting the oxide semiconductor device from external light.

A buffer layer 120 covers the light blocking layer 110. The buffer layer 120 may prevent or at least reduce ions or impurities from being diffused from the substrate 100 and block or at least reduce moisture penetration. In addition, the buffer layer 120 may improve surface flatness of the substrate 100. The buffer layer 120 may include an inorganic material such as oxide and nitride, an organic material, or an organic-inorganic complex material, and may be formed in a single layer or multi-layer structure. For example, the buffer layer 120 may have a structure of three or more layers consisting of silicon oxide, silicon nitride, and silicon oxide.

The active layer 210 is formed on the buffer layer 120. The active layer 210 may be formed of a silicon-based semiconductor material or an oxide-based semiconductor material. Amorphous silicon or polycrystalline silicon may be used as the silicon-based semiconductor material. As the oxide-based semiconductor material, a quaternary metal oxide such as indium tin gallium zinc oxide (InSnGaZnO), ternary metal oxides such as indium gallium zinc oxide (InGaZnO), indium tin zinc oxide (InSnZnO), indium aluminum zinc oxide (InAlZnO), tin gallium zinc oxide (SnGaZnO), aluminum gallium zinc oxide (AlGaZnO), and tin aluminum zinc oxide (SnAlZnO), binary metal oxide such as indium zinc oxide (InZnO), tin zinc oxide (SnZnO), aluminum zinc oxide (AlZnO), zinc magnesium oxide (ZnMgO), tin magnesium oxide (SnMgO), indium magnesium oxide (InMgO), indium gallium oxide (InGaO), and indium oxide (InO), tin oxide (SnO), and zinc oxide (ZnO), and the like.

The active layer 210 may include a source region and a drain region containing p-type or n-type impurities, and channel regions CH1 and CH2 formed between the source region and the drain region. In an embodiment, at least two channel regions CH1 and CH2, which are mutually spaced, may be formed between the source region and the drain region in the active layer 210. In this case, the mutually spaced two channel regions CH1 and CH2 by the bent shape of the active layer 210 may be arranged side by side in the row direction X. However, the shape of the active layer 210 is not limited thereto. For example, in another embodiment, one channel region CH1 or CH2 may be formed in the active layer 210, and the active layer 210 may be formed in a non-bent bar shape.

A gate insulating layer 130 may be formed on the active layer 210. The gate insulating layer 130 may be silicon oxide (SiOx), silicon nitride (SiNx), or multiple layers thereof.

The first conductive layer is formed on the gate insulating layer 130. The first conductive layer may include the gate electrode 220. Also, the first conductive layer may further include the gate line GL. In an embodiment, the gate line GL is formed to substantially extend at one side of the opening area OA along the row direction X.

Here, the gate electrode 220 may be disposed to be overlapped with the channel region of the corresponding active layer 210. As illustrated, when the two channel regions CH1 and CH2 are formed on the active layer 210, the gate electrode 220 is disposed to overlap the two channel regions CH1 and CH2 and may constitute the thin film transistor 200 having a two-gate structure.

The gate electrode 220 may be integrally formed with the gate line GL electrically connected to the gate electrode 220 to configure one pattern. For example, the gate electrode 220 may be a region overlapping the channel regions CH1 and CH2 of the active layer 210 on the gate line GL.

An interlayer-insulating layer 140 may cover the first conductive layer. The interlayer-insulating layer 140 may be silicon oxide (SiOx), silicon nitride (SiNx), or multiple layers thereof.

The second conductive layer is formed on the interlayer-insulating layer 140. The second conductive layer may include the source electrode 230 and the drain electrode 240. In addition, the second conductive layer may further include the data line DL. The source electrode 230 and the drain electrode 240 may be connected to the source region and the drain region of the active layer 210, respectively. According to an embodiment, at least one of the source electrode 230 and the drain electrode 240 may be formed integrally with the data line DL electrically connected, thereby forming one pattern. For example, the source electrode 230 may be one region of the data line DL disposed on the same layer.

In an embodiment, the data line DL extends along the column direction Y in the non-opening area NOA. In such embodiment, the source electrode 230 and the drain electrode 240 are one region on the data line DL extending in the column direction (Y) or a region branching from the extended data line DL.

In the present embodiment, the second conductive layer may further include the touch sensing line SL. The touch sensing line SL crosses the opening area OA and extends along the column direction Y. The touch sensing line SL is disposed on the same layer as the data lines DL and is disposed in the non-opening area NOA. For example, the data lines DL and the touch sensing lines SL may be alternately disposed along the row direction X on the display panel 50.

In an embodiment, the data line DL and the touch sensing line SL may be disposed to overlap each other on different layers. In such embodiment, a planarization layer or the like may be interposed between the data line DL and the touch sensing line SL. The planarization layer may be provided to alleviate a step difference in the underlying structure.

However, in the present embodiment, the data line DL and the sensing line SL are disposed on the same layer while being mutually spaced apart. In this case, the source-drain electrodes 230 and 240, the data line DL, and the sensing line SL may be formed in a single process. Also, the process for forming the planarization layer is omitted since the data line DL and the sensing line SL are on the same layer due to being formed during the single process. As a result, a manufacturing process of the display device 1 according to the present embodiment can be simplified and the number of masks required for the process can be reduced, and the production cost thereof can be reduced.

The second conductive layer may be covered by a first passivation layer 150.

According to an embodiment, a third conductive layer may be formed on the first passivation layer 150. The third conductive layer may include, for example, a dummy line. In an embodiment where the data line DL and the touch sensing line SL are disposed on different layers to overlap each other, the dummy line is disposed to be overlapped in at least a portion with the data line DL and the touch sensing line SL. The dummy line may be electrically floated during the driving period to distribute noise by the wirings and may reduce noise of the touch sensing signal detected through the touch sensing line SL.

However, in the present embodiment, since the touch sensing line SL is spaced apart from the data line DL, noise by the other wirings is reduced. Accordingly, the dummy line is not required, and the process of forming the third conductive layer may be omitted. As a result, a manufacturing process of the display device 1 according to the present embodiment can be simplified and the number of masks required for the process can reduced, and the production cost thereof can be reduced.

The pixel electrode 310 is formed on the first passivation layer 150. The pixel electrode 310 may be widely formed within the opening area OA. When the opening area OA is formed in such a manner that a length in the row direction X is longer than a length in the column direction Y, the pixel electrode 310 may have a generally rectangular shape in which a length in the row direction X is longer than a length in the column direction Y along the shape of the opening area OA. Also, the pixel electrode 310 may be disposed as to be overlapped in at least one region with the touch sensing line SL passing through the opening area OA.

The pixel electrode 310 may be covered by a second passivation layer 160. The first and second passivation layers 150 and 160 may be a silicon oxide film (SiOx), a silicon nitride film (SiNx), or multiple layers thereof, as insulating layers for protecting the covered elements.

The common electrode 320 may be formed on the second passivation layer 160. The common electrode 320 is generally formed in the opening area OA, and may be arranged to extend from the opening area to the non-opening area NOA. The common electrode 320 is electrically connected to the touch sensing line SL through a contact hole.

In an embodiment, the common electrode 320 may include the branch portions 321 arranged side by side at equal intervals and the stem portion 322 connecting the branch portions 321 to each other. The branch portions 321 may extend substantially in the row direction X within the opening area OA, and the stem portions 322 may extend in the column direction Y while connecting the branch portions 321 to each other at both ends of the branch portions 321. Here, a length of the branch portions 321 may be formed to be longer than a length of the stem portions 322.

A cover substrate 400 may be disposed on the substrate 100. A color filter 410 may be formed on the cover substrate 400. The color filter 410 may be disposed to overlap the opening area OA. The color filter 410 is a wavelength-selective optical filter selectively transmitting only a partial wavelength band of incident light, in such a manner as to transmit light in a specific wavelength band and block light in another specific wavelength band, and may be composed of a photosensitive resin containing a colorant such as a pigment or dye. Light passing through the color filter 410 in the opening area OA may have any one of red, green, and blue colors. When the pixel PX displays a white color, the color filter 410 may be omitted for the pixel PX.

A black matrix 420 may be disposed between the color filters 410 of each color. The black matrix 420 is disposed around the color filter 410 between adjacent color filters 410 and may prevent light leakage and color mixing between the pixels PX of each color.

In an embodiment, the black matrix 420 is disposed to be overlapped in at least one region with the touch sensing line SL. Such black matrix 420 has a pattern in which at least one region crosses the opening area OA and extends along the column direction Y.

In an embodiment, a bump pattern may be formed on the common electrode 320.

The bump pattern is disposed to overlap the black matrix, so that color mixing between adjacent pixels PX may be prevented. In the present embodiment, the sensing line SL is disposed to overlap the black matrix 420, so that the black matrix 420 of substantially double layers may be implemented. Through the structure as such, in the present embodiment, a decrease in the aperture ratio of the pixel PX can be reduced, color mixing can be prevented or at least reduced, and an increase in the thickness of the black matrix can be prevented.

A light emission control means such as a liquid crystal layer may be included between the substrate 100 and the upper substrate 400.

Hereinafter, a manufacturing method of the display device 1 having the structure as above will be described in detail.

FIGS. 6 to 21 are cross-sectional views illustrating a manufacturing method of a display device according to an embodiment of the present disclosure.

Figure 6:
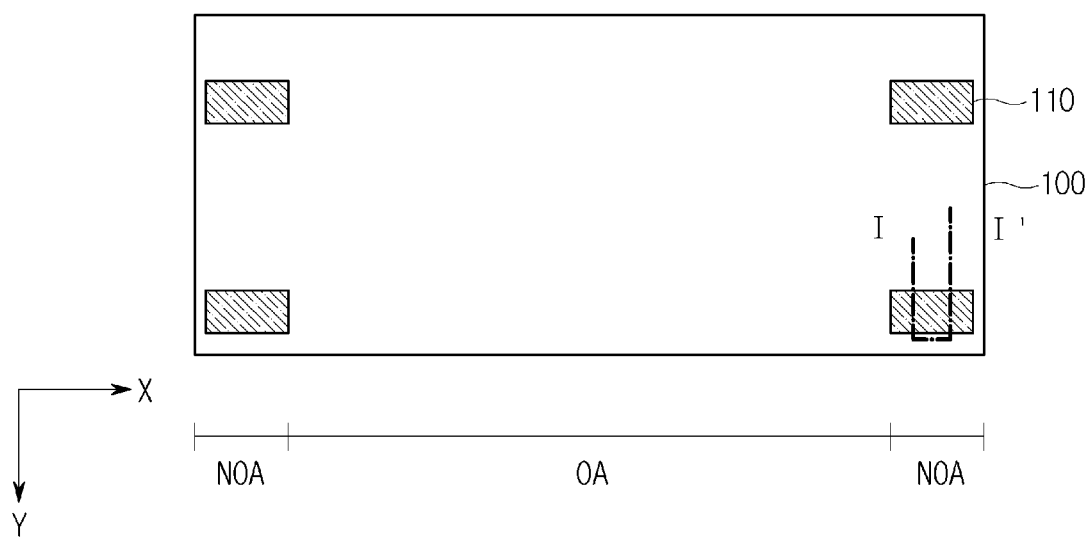
FIGS. 6 to 21 are cross-sectional views illustrating a manufacturing method of a display device according to an embodiment of the present disclosure.
Figure 7:
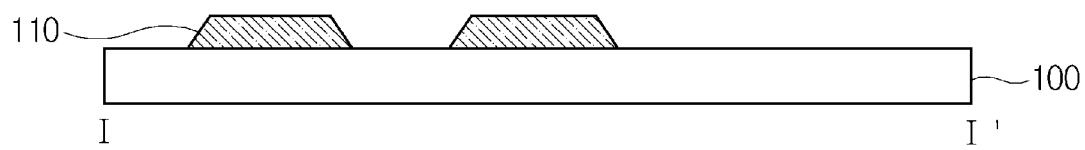

Referring to FIGS. 6 and 7, the light blocking layer 110 may be formed on the substrate 100. The light blocking layer 110 may be generated by forming a conductive film on the substrate 100 through a printing process, a sputtering process, a chemical vapor deposition process, a pulsed laser deposition (PLD) process, a vacuum deposition process, an atomic layer deposition process, or the like; and by performing patterning through an etching process using a mask. Here, a first mask may be used.

Figure 8:
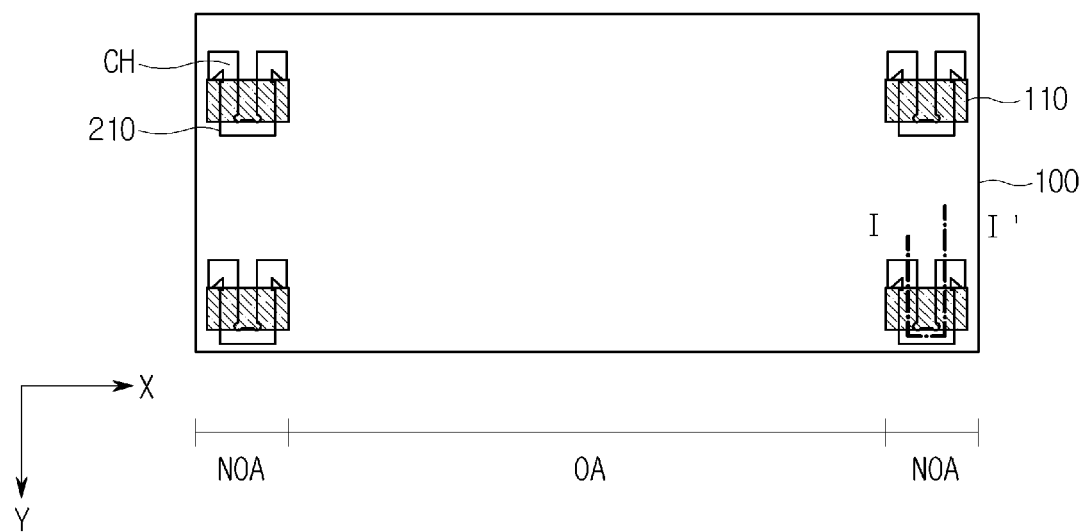
Figure 9:
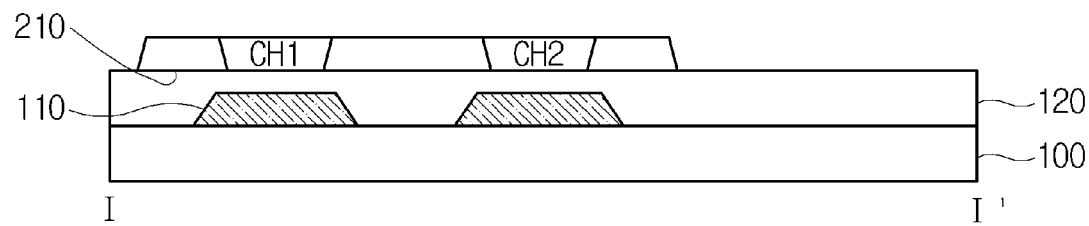

Referring to FIGS. 8 and 9, thereafter, the buffer layer 120 may be formed on the light blocking layer 110. The buffer layer 120 may be formed through a chemical vapor deposition process, a spin coating process, a plasma-enhanced chemical vapor deposition process, a sputtering process, a vacuum deposition process, a high-density plasma-chemical vapor deposition process, a printing process, or the like.

The active layer 210 may be formed on the buffer layer 120. For example, an amorphous silicon layer may be formed on the buffer layer 120, and the amorphous silicon layer may be crystallized to form a polysilicon layer. Thereafter, the polysilicon layer is subjected to patterning through photolithography, or the like, thereby forming the active layer 210. Here, a second mask may be used for the photolithography process. Impurities are injected into the polysilicon layer constituting the active layer 210 so that the source region, the drain region, and the channel CH may be formed.

Figure 10:
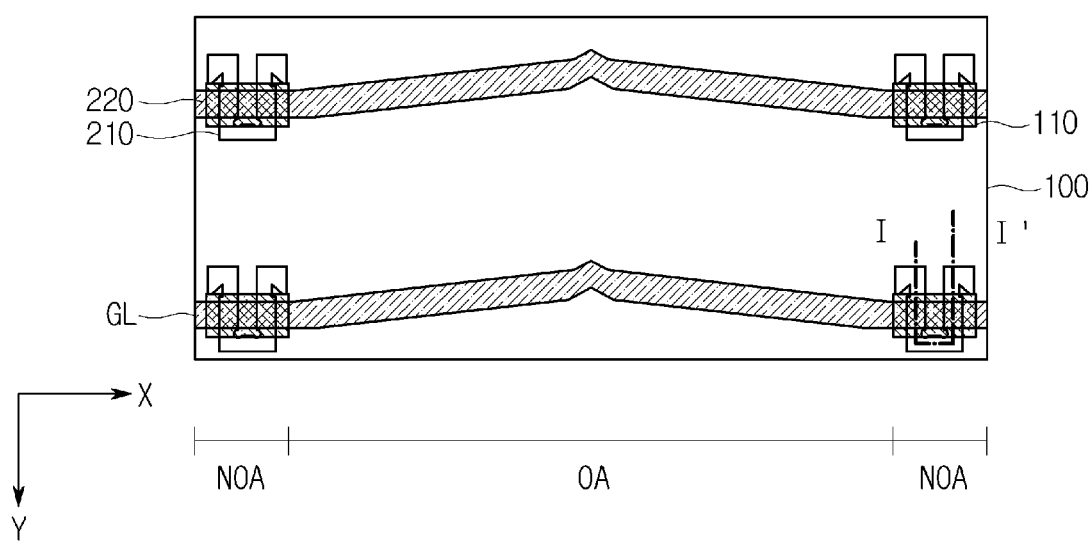
Figure 11:
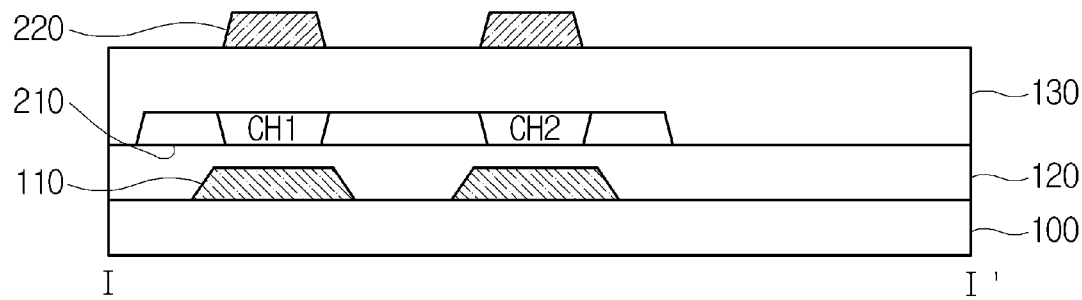

Referring to FIGS. 10 and 11, the gate insulating layer 130 may be formed on the active layer 210. The gate insulating layer 130 may be formed through a chemical vapor deposition process, a spin coating process, a plasma-enhanced chemical vapor deposition process, a sputtering process, a vacuum deposition process, a high-density plasma-chemical vapor deposition process, a printing process, or the like.

The first conductive layer may be formed on the gate insulating layer 130. For example, the gate electrode 220 and the gate line GL connected thereto may be formed on the gate insulating layer 130. The gate electrode 220 may be formed in one pattern formed integrally with the gate line GL. In an embodiment, the gate line GL may be formed in a shape extending substantially along the row direction X.

The first conductive layer is formed by forming a conductive film on the gate insulating layer 130 using a printing process, a sputtering process, a chemical vapor deposition process, a pulse laser deposition process, a vacuum deposition process, an atomic layer deposition process, or the like, and by performing patterning through an etching process using a mask. Here, a third mask may be used.

Figure 12:
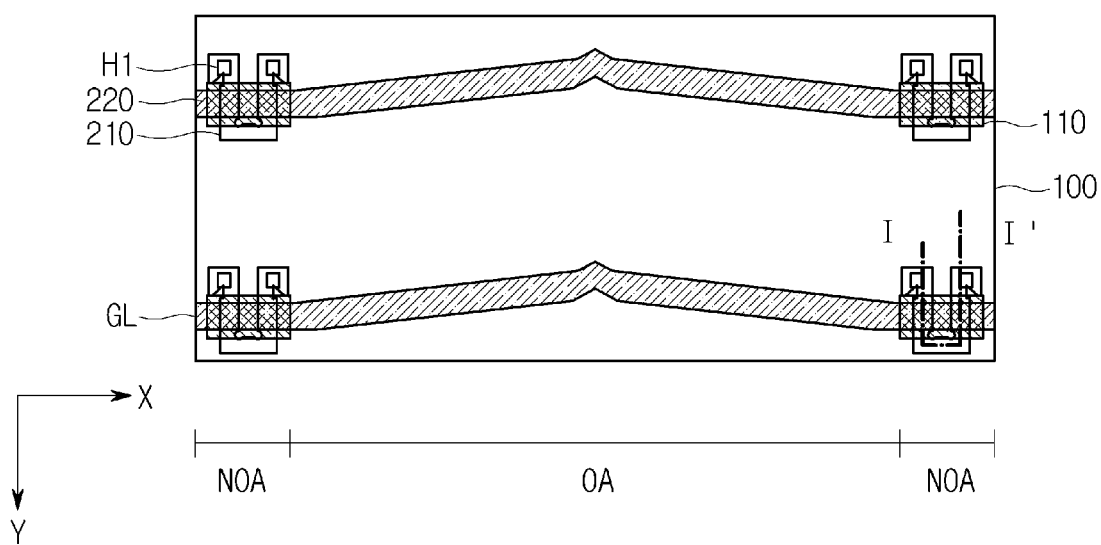
Figure 13:
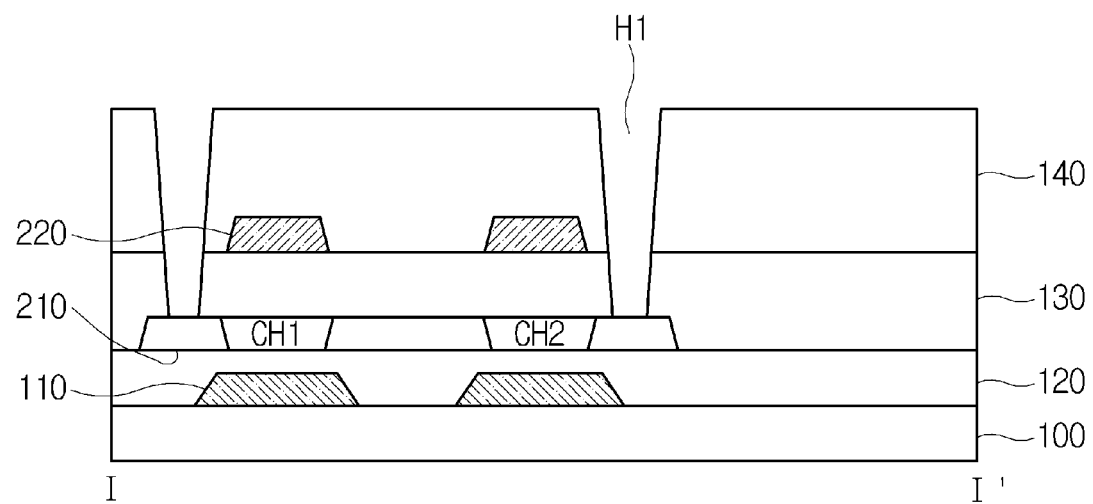

Referring to FIGS. 12 and 13, the interlayer-insulating layer 140 may be formed to cover the first conductive layer. First contact holes H1 for contacting the second conductive layer and the underlying layer may be formed in the interlayer-insulating layer 140. Specifically, the interlayer-insulating layer 140 is formed on the entire surface of the substrate 100, and a mask process is performed to expose upwardly one region of the active layer 210 corresponding to the region of the first contact hole H1. A fourth mask may be used in the process of forming the first contact hole H1.

Figure 14:
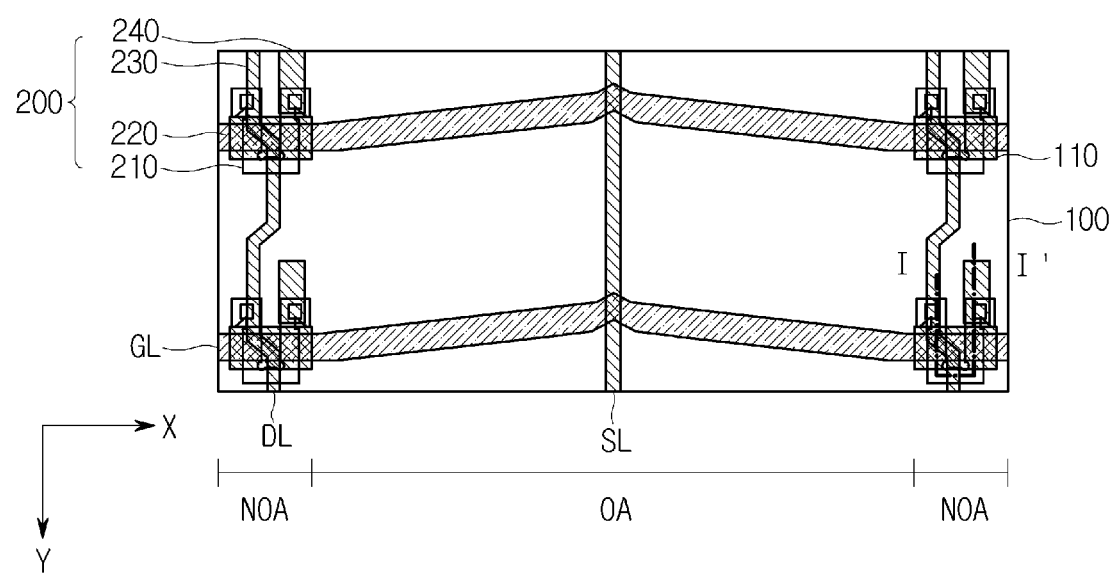
Figure 15:
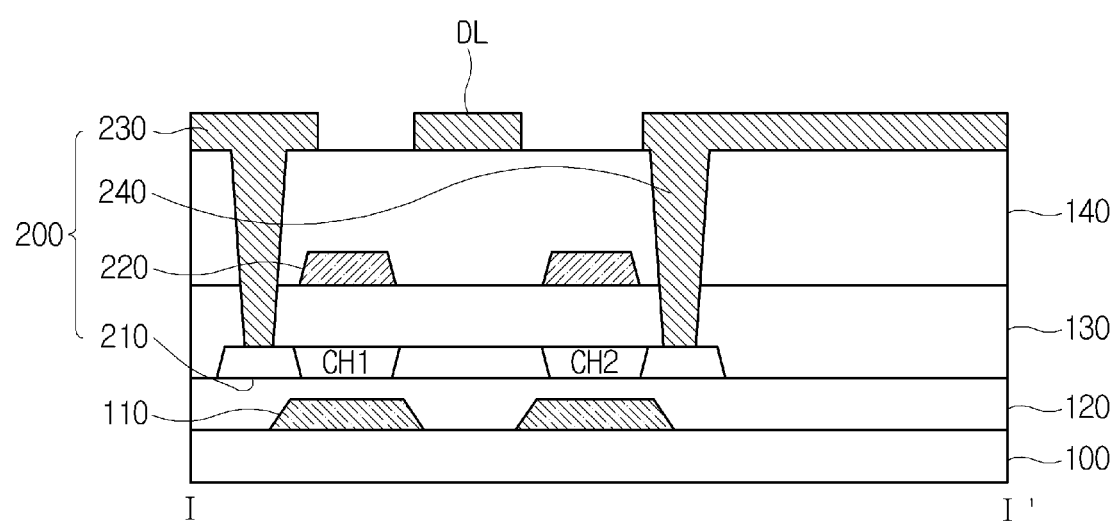

Referring to FIGS. 14 and 15, the second conductive layer may be formed on the interlayer-insulating layer 140. For example, the source electrode 230 and the drain electrode 240 and the data line DL connected to at least one of them may be formed on the interlayer-insulating layer 140. In an embodiment, the source electrode 230 may be formed in one pattern formed integrally with the data line DL. In an embodiment, the data line DL may be formed to extend substantially along the column direction Y.

In an embodiment, the touch sensing line SL may be further formed on the interlayer-insulating layer 140. The touch sensing line SL may be formed to be spaced apart from the data line DL and extend substantially along the column direction Y.

The second conductive layer is formed by forming a conductive film on the interlayer-insulating layer 140 using a printing process, a sputtering process, a chemical vapor deposition process, a pulse laser deposition process, a vacuum deposition process, an atomic layer deposition process, or the like, and by performing patterning through an etching process using a mask. Here, a fifth mask may be used.

Figure 16:
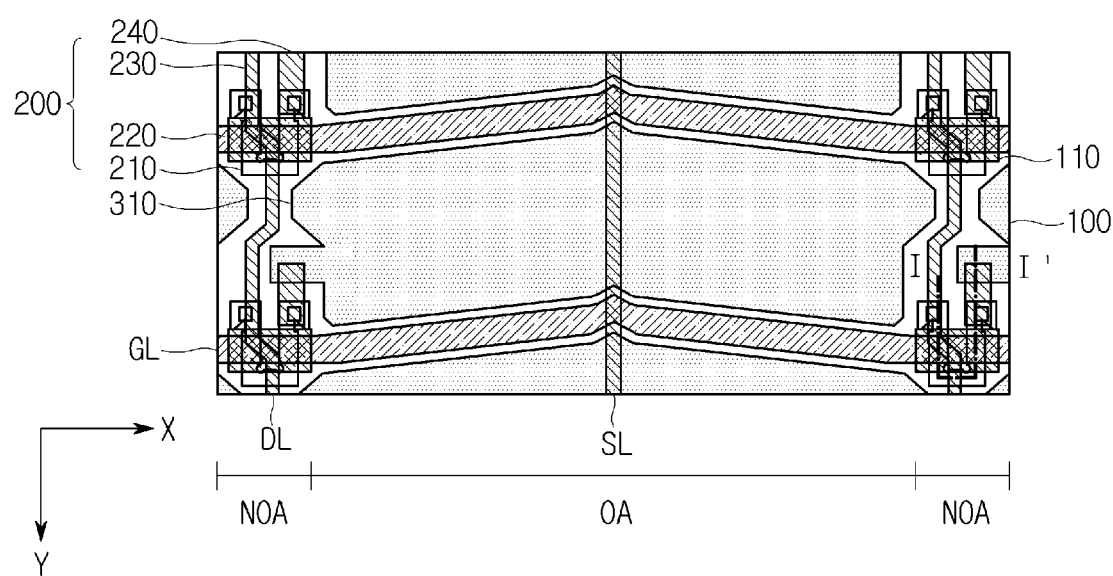
Figure 17:
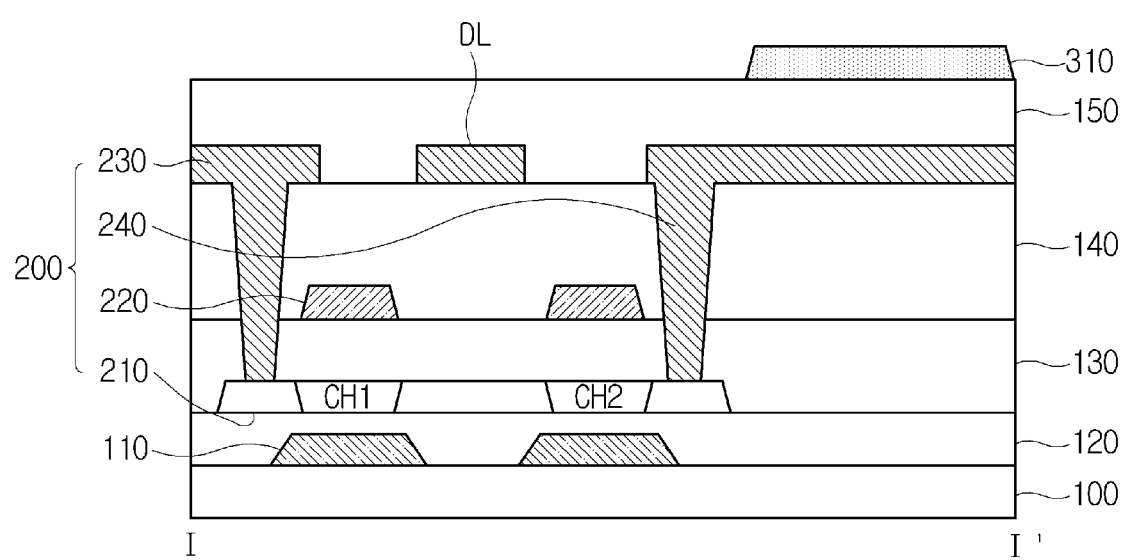

Referring to FIGS. 16 and 17, the first passivation layer 150 may be formed on the second conductive layer. Also, the pixel electrode 310 may be formed on the first passivation layer 150. The pixel electrode 310 is patterned through an etching process using a mask so as to be formed to correspond to the opening area OA. Here, a sixth mask may be used.

Figure 18:
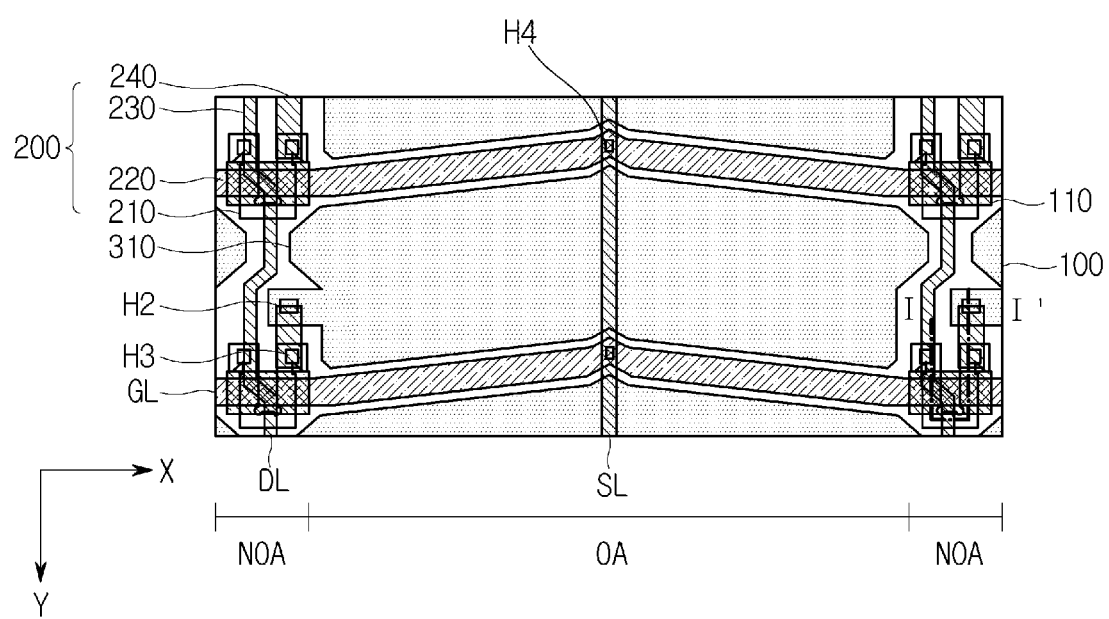
Figure 19:
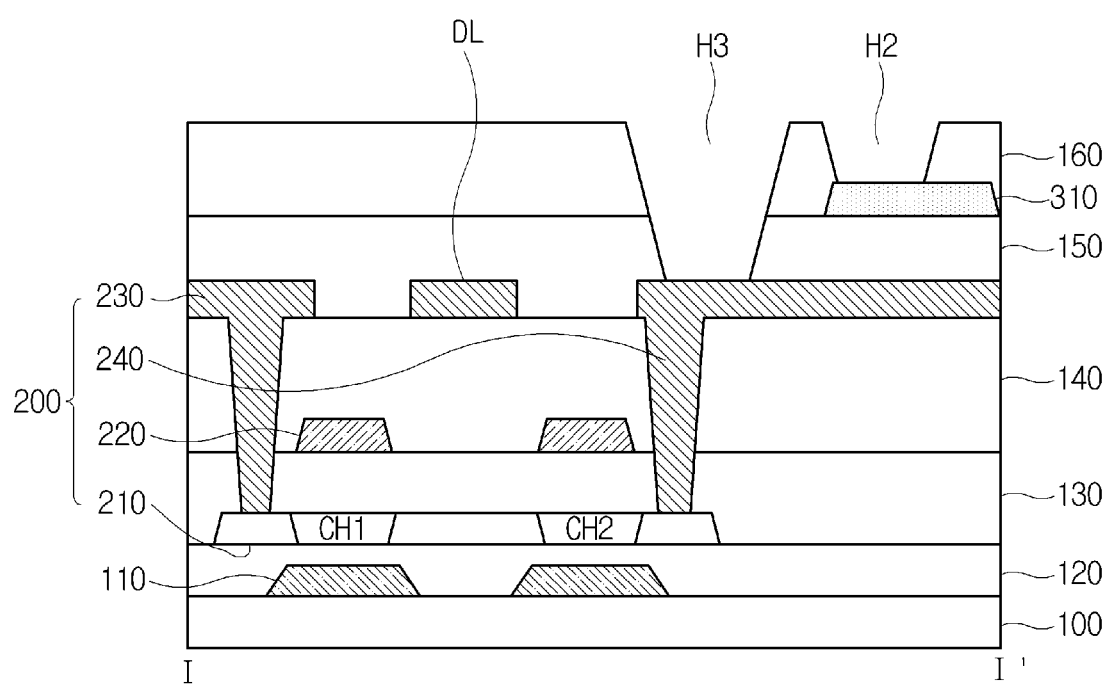

Referring to FIGS. 18 and 19, the second passivation layer 160 may be formed on the pixel electrode 310. Thereafter, contact holes H2 and H3 for contacting with the pixel electrode 310 and the underlying layer, for example, with the drain electrode 240 may be formed. For example, the second contact hole H2 is formed to penetrate the second passivation layer 160 and may connect the pixel electrode 310 and an island pattern of the common electrode 320 to be formed later, and the third contact hole H3 is formed to penetrate the second passivation layer 160 and the first passivation layer 150, and may connect the drain electrode 240 and the island pattern 324 of the common electrode 320.

Also, a contact hole H4 for connecting the touch sensing line SL and the common electrode 320 may be further formed. For example, the fourth contact hole H4 is formed to penetrate the first and second passivation layers 150 and 160, and thus may connect the common electrode 320 and the touch sensing line SL (FIG. 5). These contact holes H2, H3, and H4 may be formed through a mask process, and here, a seventh mask may be used.

Figure 20:
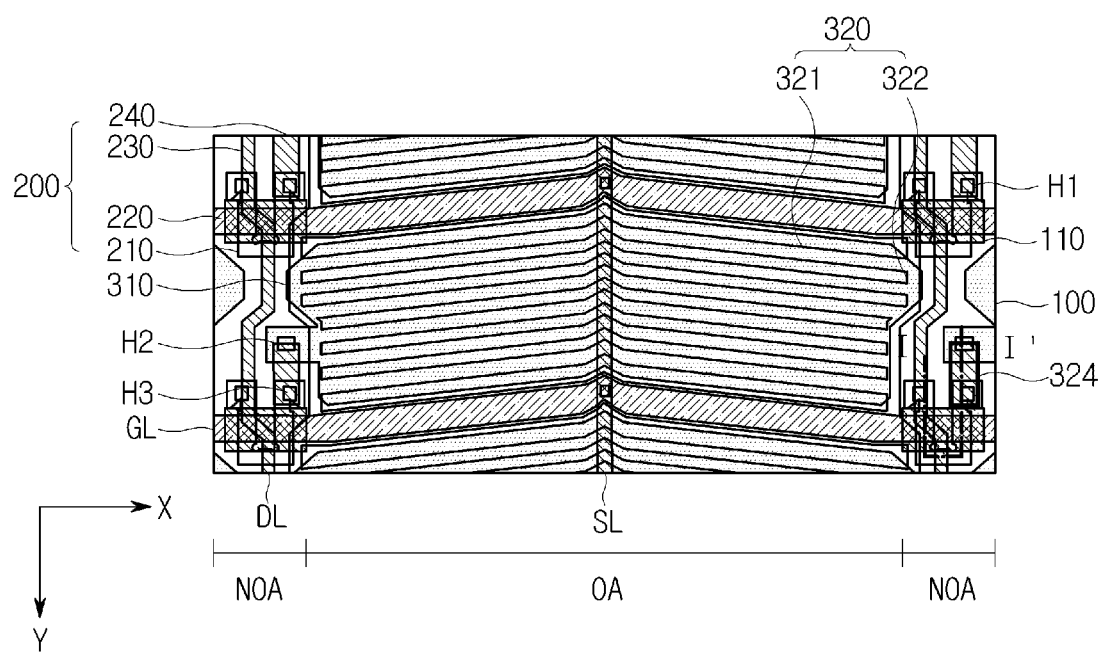
Figure 21:
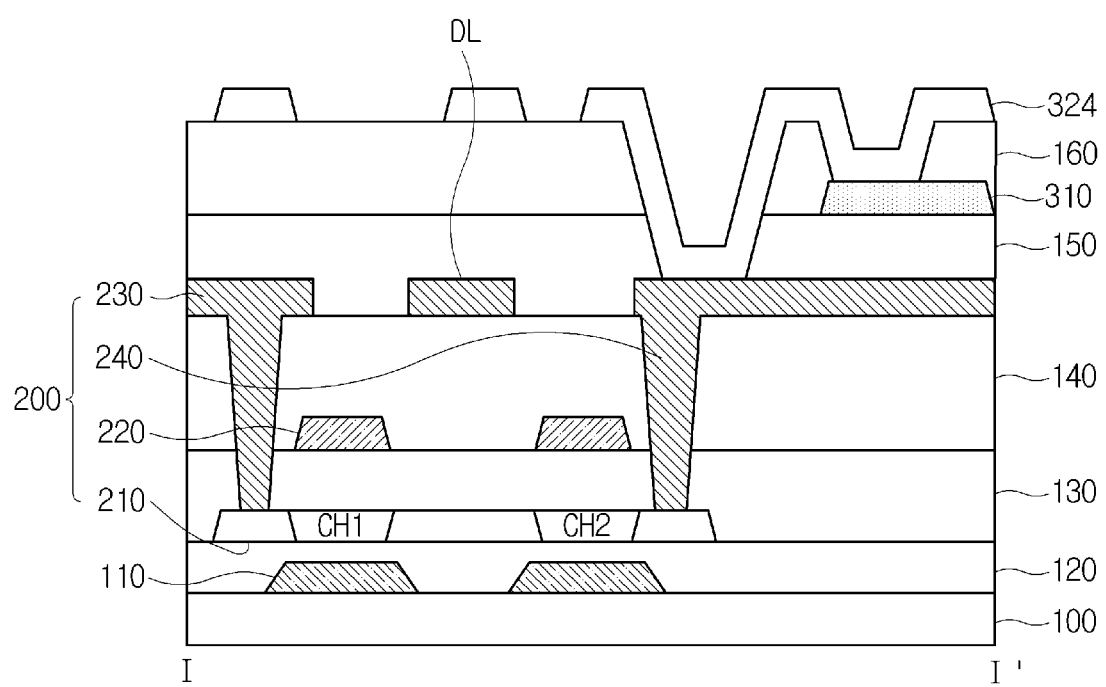

Referring to FIGS. 20 and 21, the common electrode 320 is formed on the second passivation layer 160. The common electrode 320 is formed to include the branch portions 321 arranged side by side at the equal intervals and the stem portion 322 connecting the branch portions 321. The branch portions 321 extend substantially in the row direction X within the opening area OA, and the stem portions 322 are formed to extend in the column direction Y while connecting the branch portions 321 to each other at both ends of the branch portions 321. The common electrode 320 may be formed by performing a mask process to have a shape corresponding thereto. In this case, an eighth mask may be used.

A portion of the common electrode 320 may be formed as an island pattern 324 overlapping the second and third contact holes H2 and H3. The island pattern 324 may have various shapes, such as a circle, an ellipse, and a polygon. The island pattern may be connected to the pixel electrode 310 and the drain electrode 240 through the second and third contact holes H2 and H3, and thus may electrically connect them.

In the display device 1 according to the present embodiment, the stacked structure of the lower substrate 100 is manufactured through the eight mask processes as described above. In another embodiment, in the embodiment in which the touch sensing line SL is formed on a separate upper conductive layer or the dummy line is required, the number of required mask processes is further increased. In addition, when the bump pattern is additionally formed, the number of required mask processes may increase up to eleven.

However, in the present embodiment, since the lower substrate 100 can be manufactured through eight mask processes, the manufacturing process can be simplified and the manufacturing cost can be reduced.

Figure 22:
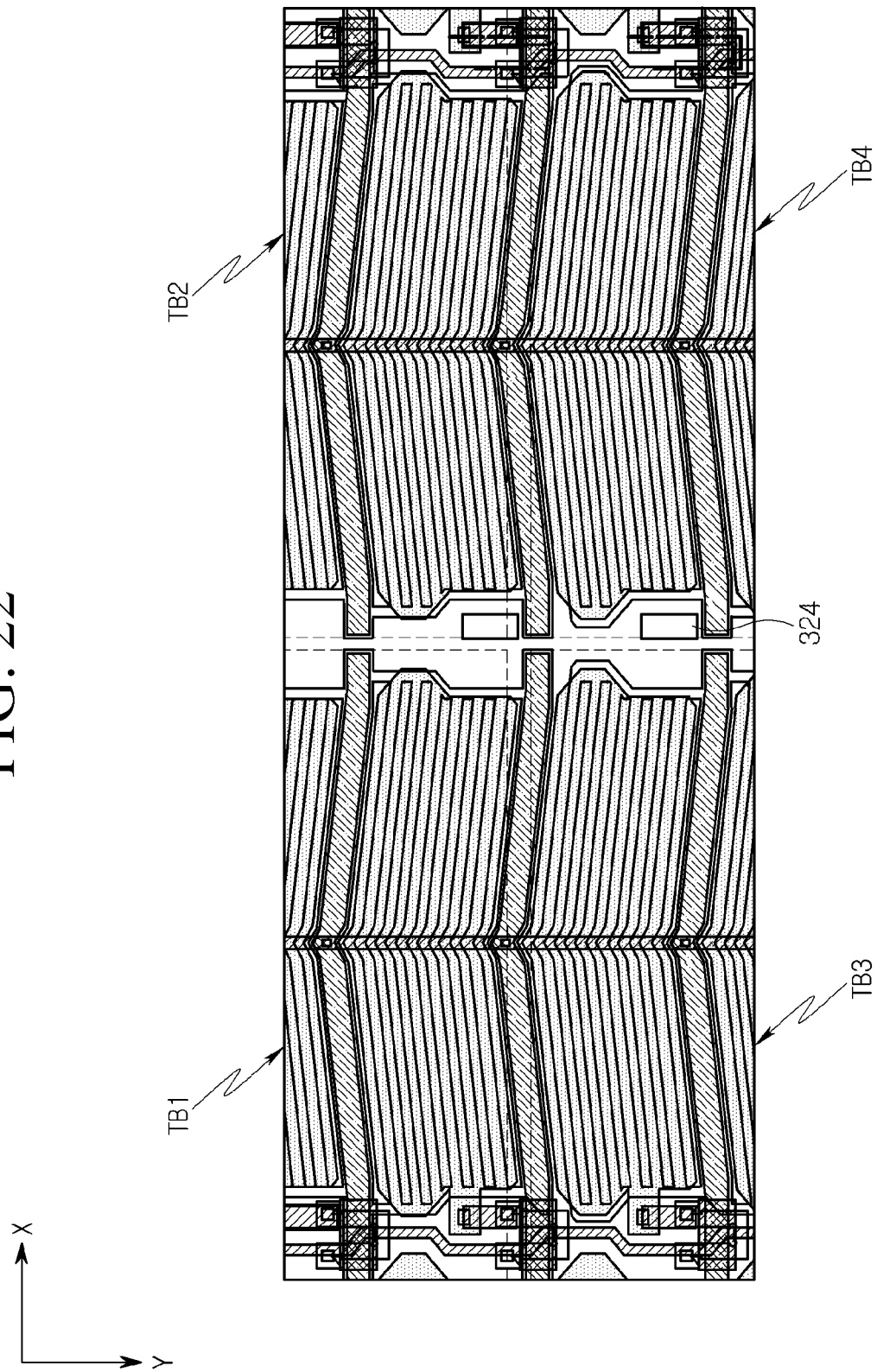
FIG. 22 is an enlarged plan view of a region of a display device according to an embodiment of the present disclosure.

FIG. 22 is an enlarged plan view of a region of a display device according to an embodiment. Specifically, FIG. 22 shows four adjacent touch blocks TB1 to TB4.

The respective touch blocks TB1 to TB4 may correspond to a plurality of pixels. The common electrodes 320 of pixels included in each of the touch blocks TB1 to TB4 may be connected to each other and serve as one touch sensing electrode TE (refer to FIG. 2). At the boundary between the different touch blocks TB1 to TB4, the common electrodes 320 are not connected to each other and are separated.

As described with reference to FIGS. 3 and 5, these touch sensing electrodes TE may be connected to the touch sensing line SL through a contact hole to transmit a touch scan signal. As illustrated, the touch sensing line SL is not disposed at the boundary between the touch blocks TB1 to TB4, and a contact area for connecting the touch sensing line SL is not formed.

The display device and the manufacturing method of the same according to embodiments can ensure a transmittance required for a display panel and improve a viewing angle thereof.

In addition, the display device and the manufacturing method of the same according to embodiments, can reduce the number of masks during a manufacturing process and reduce manufacturing costs, by omitting the components.

Those of ordinary skill in the art to which the present disclosure pertains will appreciate that the present disclosure may be implemented in other specific forms without changing its technical spirit or essential features. Therefore, it should be understood that the embodiments described above are illustrative in all respects and not restrictive. The scope of the present disclosure is indicated by the scope of the claims, which will be described later, rather than the detailed description, and it will be appreciated that all the changed or modified forms derived from the meaning and scope of the claims and their equivalent concepts are included in the scope of the present disclosure.

What is claimed is:

1. A display device comprising:
   a pixel electrode in an opening area;
   a common electrode having at least one region that overlaps the pixel electrode in the opening area;
   a gate line extending along a row direction in a non-opening area, the non-opening area surrounding the opening area;
   a data line extending along the non-opening area in a column direction that is perpendicular to the row direction, the data line applying a data signal of an image;
   a thin film transistor including a source electrode that is connected to the data line and a drain electrode that is connected to the pixel electrode; and
   a touch sensing line extending in the column direction across the opening area, the touch sensing line is on a same layer as the data line, the source electrode, and the drain electrode with the data line located between the source electrode and the drain electrode on the same layer in at least one region, and the touch sensing line is non-overlapping with the data line, wherein the opening area has a shape in which a length of the opening area in the row direction is longer than a length of the opening area in the column direction.

2. The display device of claim 1, wherein the pixel electrode has a rectangular shape in which a length of the pixel electrode in the row direction is longer than a length of the pixel electrode in the column direction.

3. The display device of claim 1, wherein the common electrode includes:
a plurality of branch portions that extend in the row direction in the opening area, the plurality of branch portions disposed in the column direction at equal intervals such that a distance between each pair of adjacent branch portions from the plurality of branch portions is the same; and
a stem portion connecting together the plurality of branch portions, the stem portion extending in the column direction.

4. The display device of claim 1, further including:
a color filter in the opening area; and
a black matrix around the color filter and overlapping the touch sensing line.

5. The display device of claim 1, further comprising:
a substrate including the opening area and the non-opening area;
a first conductive layer on the substrate, the first conductive layer including the gate line;
a second conductive layer on the first conductive layer, the second conductive layer including the data line and the touch sensing line; and
a passivation layer on the second conductive layer,
wherein the pixel electrode is on the passivation layer, and the common electrode is on the pixel electrode.

6. The display device of claim 1, further including:
a color filter in the opening area; and
a black matrix around the color filter and overlapping the touch sensing line.

7. A display device comprising:
a plurality of pixels including a pixel having an opening area in which an image is displayed and a non-opening area where the image is not displayed, the opening area having a length in a first direction that is longer than a length of the opening area in a second direction that is different from the first direction;
a plurality of gate lines connected to the plurality of pixels, the plurality of gate lines including a gate line that extends in the first direction in the non-opening area of the pixel;
a plurality of data lines connected to the plurality of pixels, the plurality of data lines including a data line that extends in the second direction in the non-opening area of the pixel and the data line applying a data signal of an image;
a plurality thin film transistors each including a source electrode that is connected to one of the plurality of data lines and a drain electrode that is connected to one of a plurality of pixel electrodes that are included in the plurality of pixels; and
a plurality of touch sensing lines including a touch sensing line that extends in the second direction across the opening area of the pixel, the touch sensing line is on a same layer as the data line, the source electrode, and the drain electrode of one of the plurality of thin film transistors with the data line located between the source electrode and the drain electrode on the same layer in at least one region, and the touch sensing line is non-overlapping with the data line;
wherein the pixel includes a pixel electrode in the opening area of the pixel and a common electrode having a portion that overlaps the pixel electrode in the opening area, the portion of the common electrode having a length in the first direction that is longer than a length of the portion of the common electrode in the second direction.

8. The display device of claim 7, wherein the portion of the common electrode in the opening area comprises a plurality of protrusions that extend in the first direction in the opening area, the plurality of protrusions disposed in the second direction at equal intervals such that a distance between each pair of adjacent protrusions from the plurality of protrusions is the same.

9. The display device of claim 8, wherein the common electrode further comprises a connecting portion that extends in the second direction in the non-opening area, the connecting portion connecting together the plurality of protrusions.

10. The display device of claim 7, wherein the pixel electrode has a rectangular shape in which a length of the pixel electrode in the first direction is longer than a length of the pixel electrode in the second direction.

11. The display device of claim 7, further comprising:
a substrate;
a first conductive layer on the substrate, the first conductive layer including the gate line;
a second conductive layer on the first conductive layer, the second conductive layer including the data line and the touch sensing line; and
a passivation layer on the second conductive layer,
wherein the pixel electrode is on the passivation layer, and the common electrode is on the pixel electrode.

* * * * *